United States Patent
Guo

(10) Patent No.: US 12,389,556 B2
(45) Date of Patent: Aug. 12, 2025

(54) CASING ASSEMBLY AND MONITOR

(71) Applicant: WISTRON CORP., New Taipei (TW)

(72) Inventor: Minglang Guo, New Taipei (TW)

(73) Assignee: WISTRON CORP., New Taipei (TW)

(*) Notice: Subject to any disclaimer, the term of this patent is extended or adjusted under 35 U.S.C. 154(b) by 244 days.

(21) Appl. No.: 18/360,939

(22) Filed: Jul. 28, 2023

(65) Prior Publication Data
US 2024/0407111 A1  Dec. 5, 2024

(30) Foreign Application Priority Data

May 31, 2023  (CN) .......................... 202310638774.6

(51) Int. Cl.
H05K 5/02 (2006.01)

(52) U.S. Cl.
CPC ......... H05K 5/0217 (2013.01); H05K 5/0247 (2013.01)

(58) Field of Classification Search
CPC ... H05K 5/0217; H05K 5/0017; H05K 5/0247
USPC ...................................................... 361/807
See application file for complete search history.

(56) References Cited

U.S. PATENT DOCUMENTS 6,587,350 B1 * 7/2003 Lin ...................... H05K 7/1411
                                                       361/801
2002/0044419 A1 * 4/2002 Salinas ................... G06F 1/187
                                                       361/726

FOREIGN PATENT DOCUMENTS

| CN | 111614873 A | 9/2020 | |
| TW | 201928916 A | 7/2019 | |
| TW | I842095 | * 5/2024 | ............... G06F 1/16 |

* cited by examiner

Primary Examiner — Hung S. Bui
(74) Attorney, Agent, or Firm — McClure, Qualey & Rodack, LLP

(57) ABSTRACT

A casing assembly selectively accommodates an electronic accessory. The casing assembly includes a casing, an electrical connector, a first cover and a pushing mechanism. The casing has an accommodation portion and an access portion, the accommodation portion selectively accommodates the electronic accessory, and the access portion communicates with the accommodation portion. The electrical connector is disposed on the casing and selectively connected to the electronic accessory. The first cover is movably disposed on the casing and covers the access portion. The pushing mechanism is movably disposed in the accommodation portion. When the first cover is pressed downwards to expose the access portion, the pushing mechanism pushes the electronic accessory towards the access portion.

20 Claims, 18 Drawing Sheets

CASING ASSEMBLY AND MONITOR

CROSS-REFERENCE TO RELATED APPLICATIONS

This non-provisional application claims priority under 35 U.S.C. § 119 (a) on Patent Application No(s). 202310638774.6 filed in China on May 31, 2023, the entire contents of which are hereby incorporated by reference.

TECHNICAL FIELD

The disclosure relates a casing assembly and a monitor, more particular to a casing assembly storing an electronic accessory and a monitor including the same.

BACKGROUND

Monitors in the market are generally used with a webcam. There are two types of monitor assemblies, one is the webcam is irremovably disposed on a monitor, and the other is the webcam is removably disposed on a socket at the top of the monitor.

Regarding the monitor with the webcam irremovably disposed on the top of the monitor, the webcam may cause that there is a protrusion part located at the top of the monitor, reducing integrity of the appearance. As for the monitor with the webcam removably disposed on the socket at the top of the monitor, the webcam can be removed when the webcam is not required to be used for preventing the webcam from adversely affecting the appearance of the monitor, but the webcam removed from the monitor is required to be stored separately. It is troublesome to store the webcam separately, and the webcam may be easily lost. Therefore, how to solve the aforementioned issues are the crucial topics in this field.

SUMMARY

The disclosure provides a casing assembly and a monitor which are capable of properly storing the webcam and maintaining the integrity of the appearance of the monitor when the webcam is not used.

One embodiment of the disclosure provides a casing assembly. The casing assembly selectively accommodates an electronic accessory. The casing assembly includes a casing, an electrical connector, a first cover and a pushing mechanism. The casing has an accommodation portion and an access portion, the accommodation portion selectively accommodates the electronic accessory, and the access portion communicates with the accommodation portion. The electrical connector is disposed on the casing and selectively connected to the electronic accessory. The first cover is movably disposed on the casing and covers the access portion. The pushing mechanism is movably disposed in the accommodation portion. When the first cover is pressed downwards to expose the access portion, the pushing mechanism pushes the electronic accessory towards the access portion.

Another embodiment of the disclosure provides a monitor. The monitor selectively accommodates an electronic accessory. The monitor includes a casing assembly and a display panel. The casing assembly includes a casing, an electrical connector, a first cover and a pushing mechanism. The casing has an accommodation portion and an access portion, the accommodation portion selectively accommodates the electronic accessory, and the access portion communicates with the accommodation portion. The electrical connector is disposed on the casing and selectively connected to the electronic accessory. The first cover is movably disposed on the casing and covers the access portion. The pushing mechanism is movably disposed in the accommodation portion. When the first cover is pressed downwards to expose the access portion, the pushing mechanism pushes the electronic accessory towards the access portion. The display panel is disposed in the accommodation portion of the casing.

According to the casing assembly and the monitor as discussed in the above embodiments, when the electronic accessory is not required to be used, the electronic accessory can be stored in the first accommodation part, and the first cover can cover the access portion configured for withdrawing the electronic accessory, and thus the integrity of the appearance of the monitor can be maintained while meeting the requirement of storing the electronic accessory. In addition, the pushing mechanism can push the electronic accessory towards the access portion when the first cover is pressed downwards to expose the access portion, such that a user can easily withdraw the electronic accessory from the access portion and use the electronic accessory.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
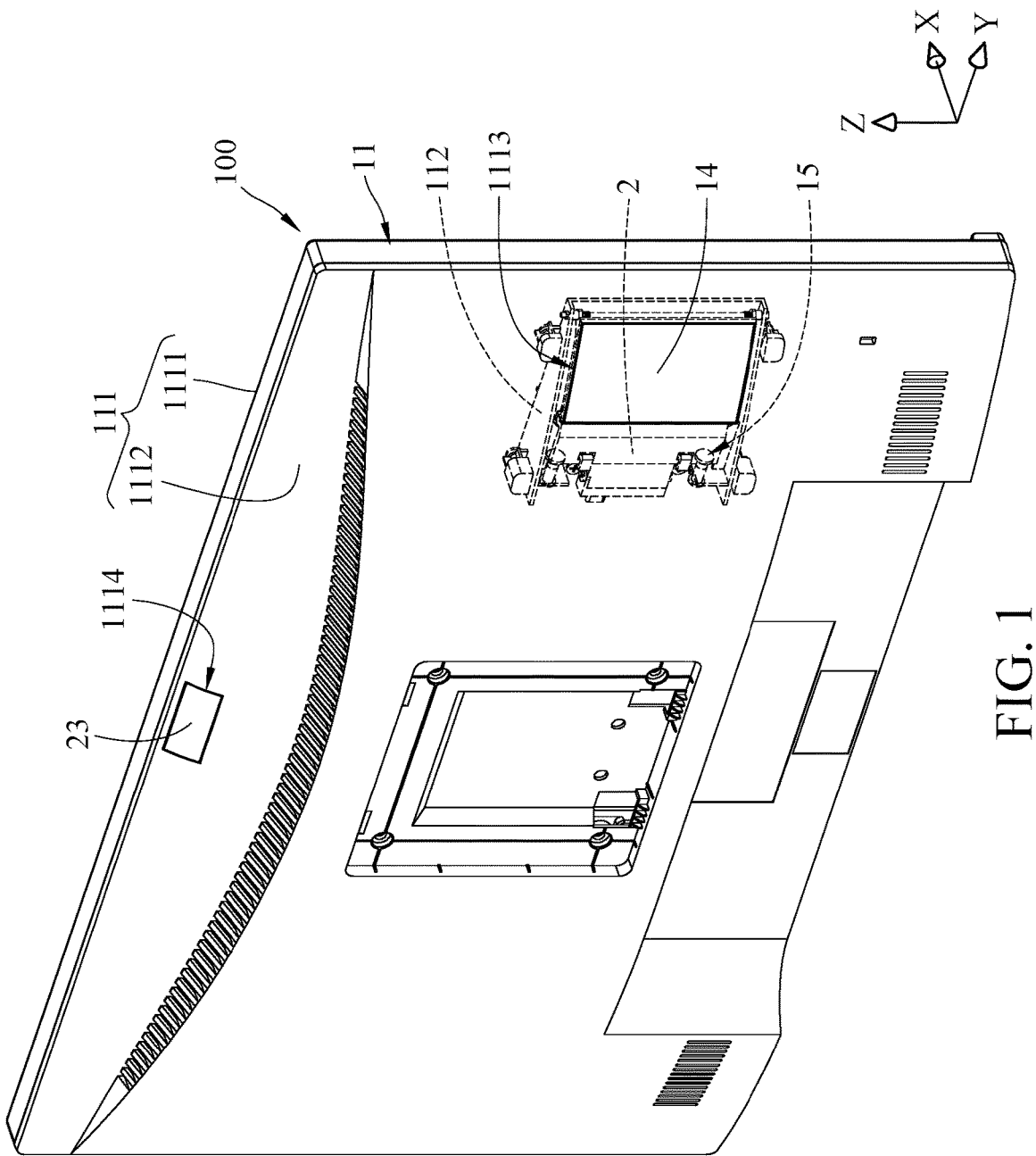
FIG. 1 is a perspective view of a monitor according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Figure 2:
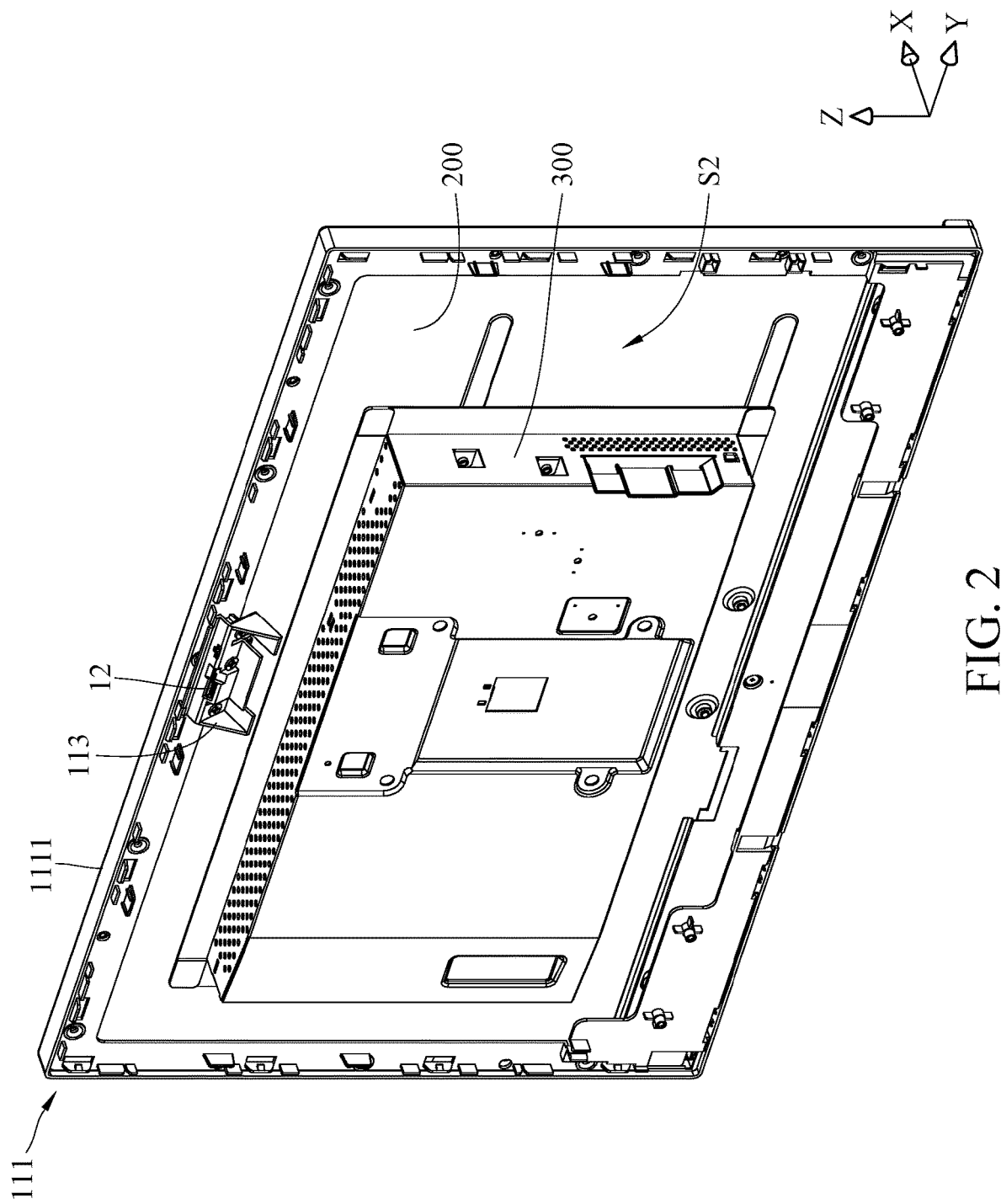
FIG. 2 is a perspective view of a front part of the monitor in FIG. 1.
Figure 3:
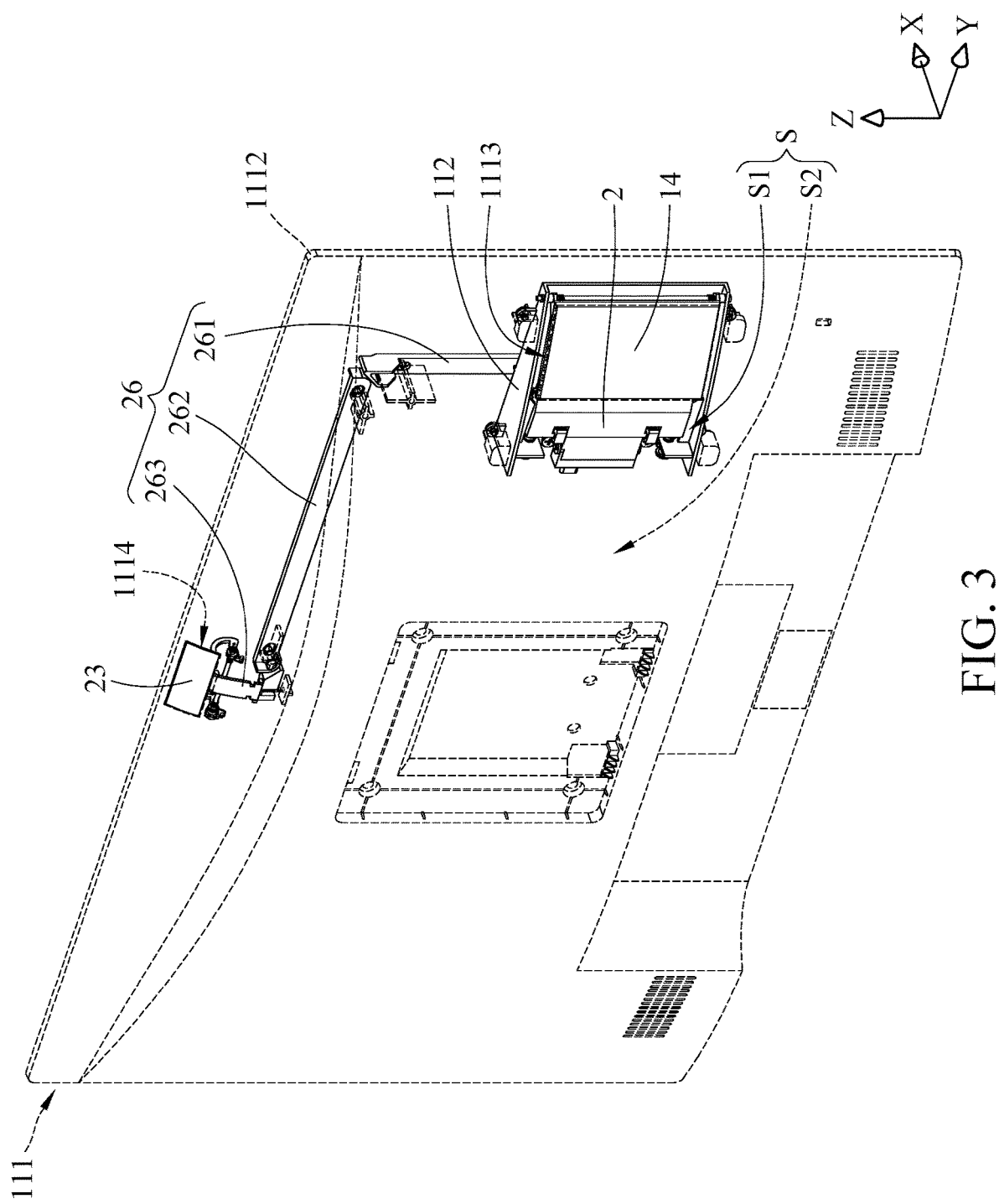
FIG. 3 is a perspective view of a rear part of the monitor in FIG. 1.
Figure 4:
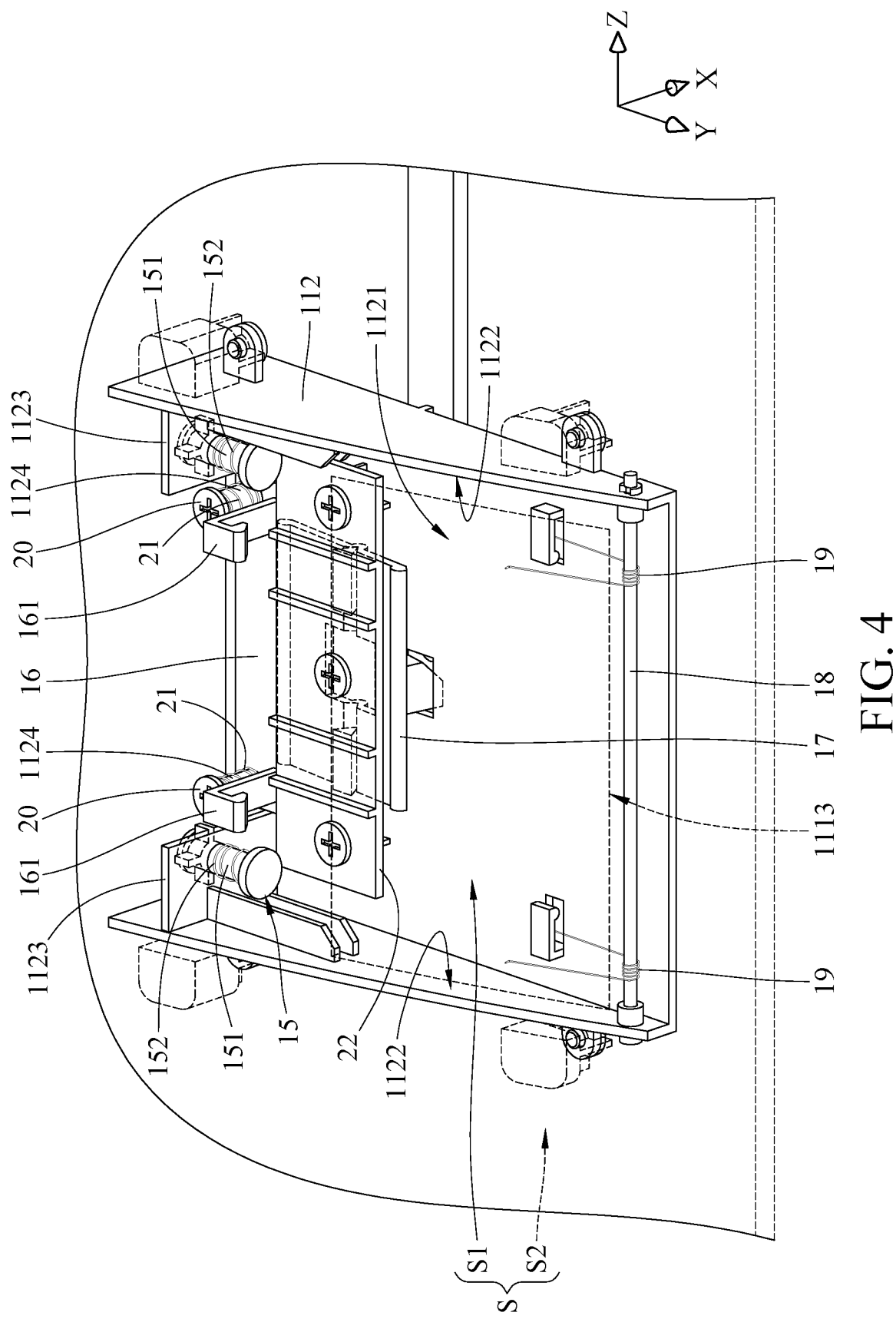
FIG. 4 is a partial and enlarged perspective view of the rear part of the monitor in FIG. 3 where a first cover and an electronic accessory are omitted.

Referring to FIGS. 1 to 4, FIG. 1 is a perspective view of a monitor 1 according to a first embodiment of the disclosure, FIG. 2 is a perspective view of a front part of the monitor 1 in FIG. 1, FIG. 3 is a perspective view of a rear part of the monitor 1 in FIG. 1, and FIG. 4 is a partial and enlarged perspective view of the rear part of the monitor 1 in FIG. 3 where a first cover 14 and an electronic accessory 2 are omitted.

As shown in FIGS. 1 and 2, the monitor 1 is configured to accommodate an electronic accessory 2. The electronic accessory 2 is, for example, a peripheral accessory, such as a camera or a microphone. In the later paragraphs, the electronic accessory 2 is, for example, illustrated as a camera. The monitor 1 includes a casing assembly 100 and a display panel 200. In addition, the monitor 1 may, for example, further include an electronic assembly 300.

As shown in FIGS. 1 to 3, the casing assembly 100 includes a casing 11, an electrical connector 12, a first cover 14 and a pushing mechanism 15. The casing 11 includes a main body 111, a storage seat 112 and a support seat 113, and the main body 111 includes a front frame 1111 and a back cover 1112 assembled with each other.

As shown in FIGS. 2 to 4, the front frame 1111 and the back cover 1112 together form an accommodation portion S. The back cover 1112 has an access portion 1113 and an insertion portion 1114. The access portion 1113 and the insertion portion 1114 communicate with the accommodation portion S, and the access portion 1113 and the insertion portion 1114 are respectively located at two adjacent sides of the monitor 1. For example, as shown in FIG. 1, the access portion 1113 and the insertion portion 1114 are respectively located at the top side (also called sky side) and the right side of the monitor 1.

As shown in FIGS. 2 to 4, the storage seat 112 is located in the accommodation portion S and fixed to the back cover 1112, and the storage seat 112 corresponds to the access portion 1113. The storage seat 112 divides the accommodation portion S into a first accommodation part S1 and a second accommodation part S2. The first accommodation part S1 is formed by the back cover 1112 and the storage seat 112. The second accommodation part S2 is a space in the accommodation portion S other than the first accommodation part S1, and the second accommodation part S2 is formed by the front frame 1111, the back cover 1112 and the storage seat 112. Although the accommodation portion S is formed by the front frame 1111 and the back cover 1112, for the purpose of illustration, the second accommodation part S2 of the accommodation portion S is still presented in FIG. 2, and the first accommodation part S1 and the second accommodation part S2 of the accommodation portion S are still presented in FIGS. 3 and 4 for showing the positions of the first accommodation part S1 and the second accommodation part S2 of the accommodation portion S. The first accommodation part S1 is configured to accommodate the electronic accessory 2. The display panel 200 and the electronic assembly 300 are disposed in the second accommodation part S2, and the display panel 200 is electrically connected to the electronic assembly 300 and can be controlled by the electronic assembly 300. The support seat 113 is located in the second accommodation part S2 and fixed to the front frame 1111, and the electrical connector 12 is disposed on the support seat 113 and corresponds to the insertion portion 1114. The electrical connector 12 is configured for the electronic accessory 2 to be installed thereon.

Note that the access portion 1113 and the insertion portion 1114 are not restricted to being located at the back cover 1112. In some other embodiments, the access portion and the insertion portion may be located at the front frame. In addition, the support seat is an optional component; in some other embodiments, the casing may not include the support seat, and the electrical connector may be directly fixed to the front frame or the back cover.

Figure 5:
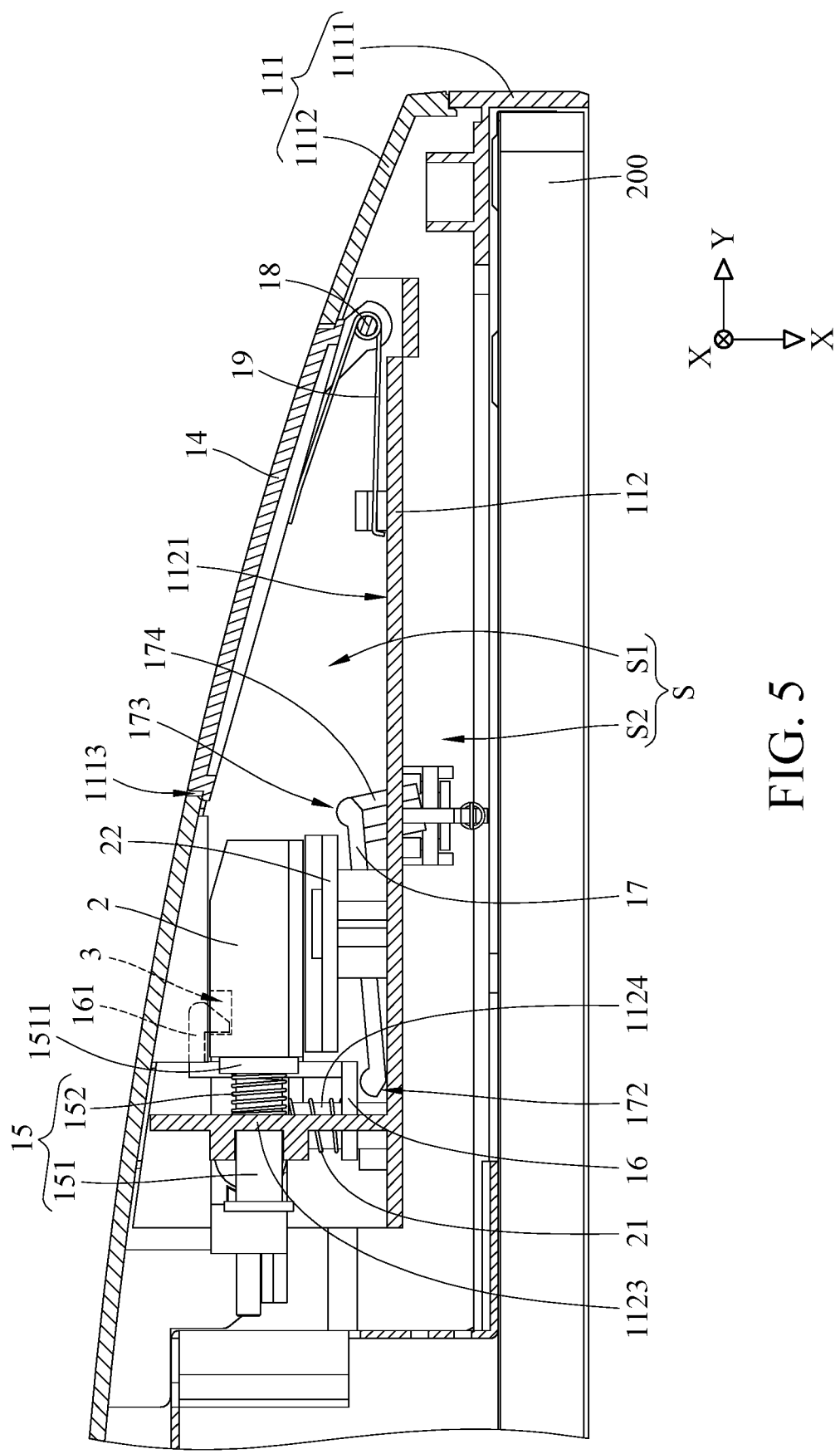
FIGS. 5 and 6 are partial and enlarged cross-sectional views of the monitor in FIG. 1 taken along different lines.
Figure 6:
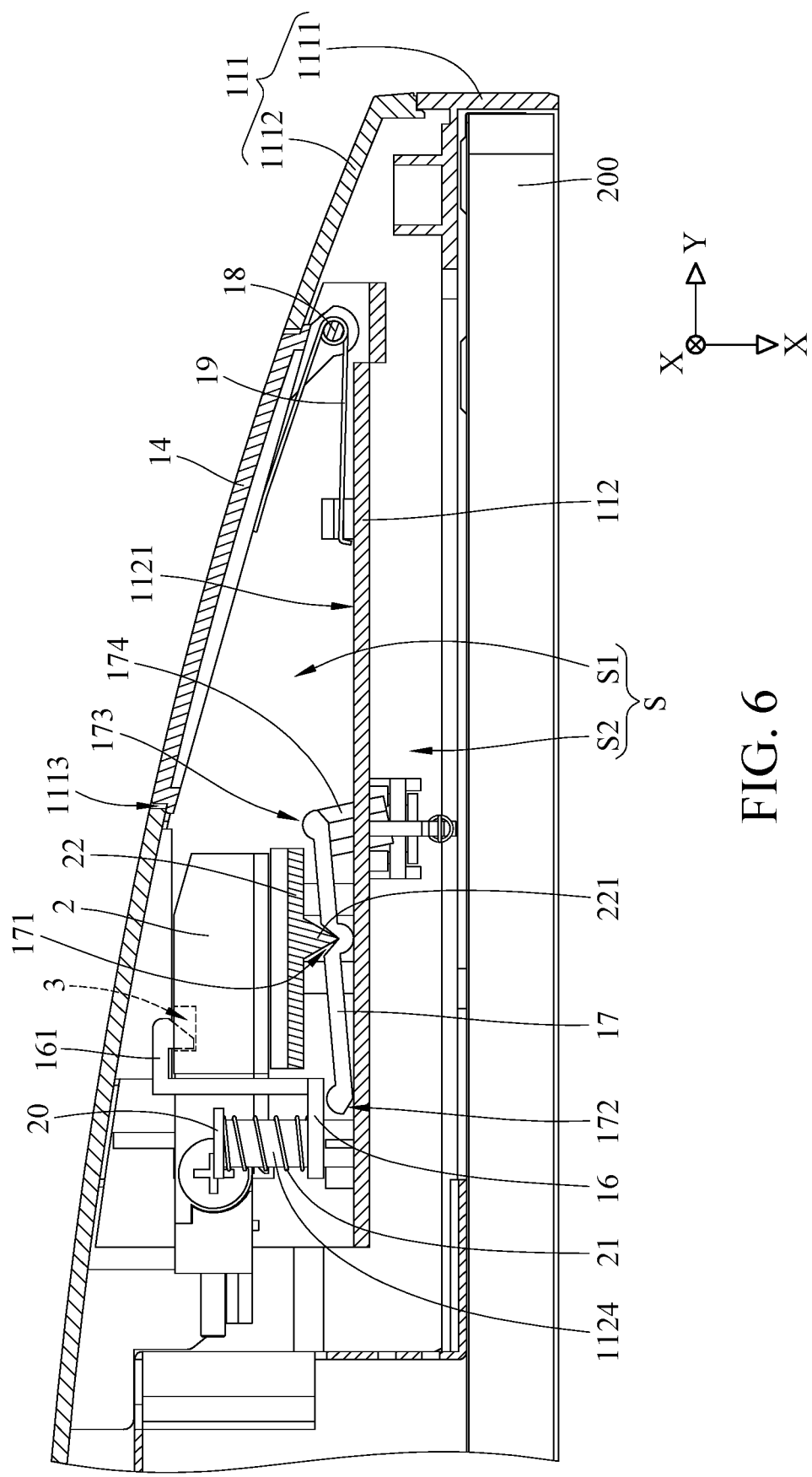

Then, referring to FIGS. 3 to 6, FIG. 4 is a partial and enlarged perspective view of the rear part of the monitor 1 in FIG. 3 where the first cover 14 and the electronic accessory 2 are omitted, and FIGS. 5 and 6 are partial and enlarged cross-sectional views of the monitor 1 in FIG. 1 taken along different lines.

As shown in FIGS. 4 and 5, the casing assembly 100 may further include a shaft 18 and two torsion applying components 19. The first cover 14 is pivotably disposed on the storage seat 112 via the shaft 18, and the first cover 14 covers the access portion 1113. The torsion applying components 19 are, for example, torsion springs. The torsion applying components 19 are sleeved on the shaft 18, and two opposite ends of each of the torsion applying components 19 are respectively in contact with the first cover 14 and the storage seat 112. The torsion applying components 19 are configured to apply forces to the first cover 14 to cover the access portion 1113. When there is no other force applied to the first cover 14, the torsion applying components 19 force the first cover 14 to constantly cover the access portion 1113.

Note that the quantity of the torsion applying components 19 is not restricted in the disclosure and may be modified to be one in some other embodiments. In another embodiment, the casing assembly may not include the torsion applying component, and the first cover may be fixed to the back cover via a snap-fit manner, such that the first cover may be still constantly cover the access portion when there is no force applied to the first cover.

As shown in FIG. 4, the storage seat 112 has a bottom surface 1121, two side surfaces 1122, two walls 1123 and two pillars 1124. The side surfaces 1122 are respectively connected to two opposite sides of the bottom surface 1121, and the side surfaces 1122 and the bottom surface 1121 face the first accommodation part S1. The walls 1123 respectively protrude from the side surfaces 1122, and the pillars 1124 protrude from the bottom surface 1121.

As shown in FIGS. 4 and 5, the pushing mechanism 15 includes two pushing components 151 and two elastic components 152. The two pushing components 151 are respectively and slidably disposed on the walls 1123 of the storage seat 112 and are located in the first accommodation part S1. The pushing components 151 are configured to be in contact with the electronic accessory 2. The elastic components 152 are, for example, compression springs. The elastic components 152 are respectively sleeved on the pushing components 151, and the elastic components 152 are respectively located between flanges 1511 of the pushing components 151 and the walls 1123. The elastic components 152 respectively apply forces to the pushing components 151 to push the electronic accessory 2 towards the access portion 1113.

Note that the quantities of the walls 1123, the pushing components 151 and the elastic components 152 are not restricted in the disclosure and may all be modified to be one in some other embodiments. In addition, the pushing mechanisms 15 are not restricted to being disposed on the walls 1123 of the storage seat 112, and the structure of the pushing mechanism 15 are not restricted in the disclosure. As long as the electronic accessory can be pushed towards the access portion by the pushing mechanism, the pushing mechanism may be disposed on any suitable structure of the storage seat, and the pushing mechanism may be any suitable structure.

As shown in FIGS. 4 and 6, the casing assembly 100 may further include an engagement component 16. The pillars 1124 of the storage seat 112 are disposed through the engagement component 16, such that the engagement component 16 is slidably disposed in the first accommodation part S1. The engagement component 16 is removably engaged with the electronic accessory 2. Specifically, the engagement component 16 has two hook structures 161. The two hook structures 161 are configured to be engaged with two engagement recesses 3 of the electronic accessory 2. Note that the quantity of the hook structures 161 is not restricted in the disclosure and may be modified to be one in some other embodiments. Moreover, the engagement component 16 is not restricted to being engaged with the electronic accessory 2 with the hook structures 161. In some other embodiments, the engagement component may be engaged with the electronic accessory with another suitable structure.

As shown in FIGS. 4 and 6, the casing assembly 100 may further include two screws 20 and two pressing components 21. The screws 20 are respectively screwed into the pillars 1124 of the storage seat 112. The pressing components 21 are, for example, compression springs. The pressing components 21 are respectively sleeved on the pillars 1124 of the storage seat 112, and opposite ends of the pressing components 21 are respectively in contact with the engagement component 16 and the screws 20. The pressing components 21 are configured to apply forces to the engagement component 16 to move the hook structures 161 towards the electronic accessory 2. When there is no other force applied to the engagement component 16, the pressing components 21 force the hook structures 161 of the engagement component 16 to stably engage with the engagement recesses 3 of the electronic accessory 2 for positioning the electronic accessory 2 in the first accommodation part S1.

Note that the quantities of the pillars 1124, the screws 20 and the pressing components 21 are not restricted in the disclosure and may all be modified to be one in some other embodiments. In addition, the pillars 1124, the screws 20 and the pressing components 21 are optional structures and components; in some other embodiments, the pillars, the screws and the pressing components may be omitted, and the engagement component may be disposed on another structure of the storage seat, and the engagement component may be stably engaged with the electronic accessory merely via gravity.

As shown in FIGS. 4 and 6, the casing assembly 100 may further include a support 22 and a swayable component 17. The support 22 is located in the first accommodation part S1 and fixed to the storage seat 112 for supporting the electronic accessory 2. The support 22 has a positioning structure 221, and the positioning structure 221 is, for example, a triangular rib. The swayable component 17 is movably located in the first accommodation part S1, and the swayable component 17 is located closer to the bottom surface 1121 of the storage seat 112 than the support 22. The swayable component 17 has a positioning recess 171, the positioning structure 221 of the support 22 is mounted into the positioning recess 171 of the swayable component 17 so as to position the swayable component 17 in the first accommodation part S1. The swayable component 17 has a first side 172 and a second side 173 located opposite to each other. The first side 172 of the swayable component 17 is in contact with the engagement component 16, and the second side 173 of the swayable component 17 corresponds to the first cover 14. Note that the support 22 is an optional component; in some other embodiments, the casing assembly may not have the support, and the electronic accessory may be supported by another structure of the storage seat, and the swayable component may be pivotably disposed on the storage seat via a shaft so as to be positioned by the shaft.

Figure 7:
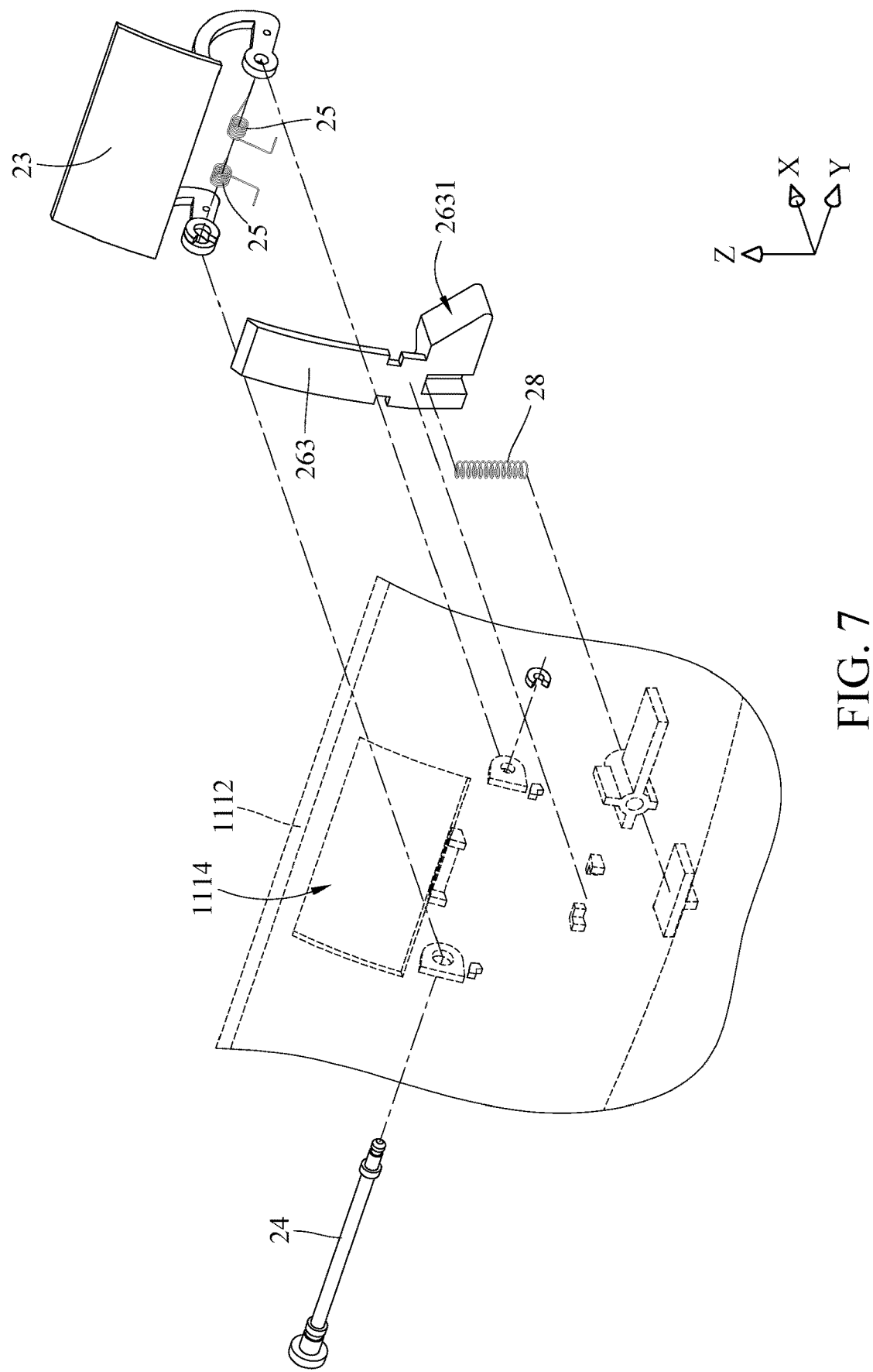
FIG. 7 is a partial and enlarged exploded view of the rear part of the monitor in FIG. 3.

Then, referring to FIG. 7, FIG. 7 is a partial and enlarged exploded view of the rear part of the monitor 1 in FIG. 3. In this embodiment, the casing assembly 100 may further include a second cover 23, a shaft 24 and two torsion biasing components 25. The second cover 23 is pivotably disposed on the back cover 1112 via the shaft 24 and covers the insertion portion 1114. The torsion biasing components 25 are, for example, torsion springs. The torsion biasing components 25 are sleeved on the shaft 24, and two opposite ends of each of the torsion biasing components 25 are respectively in contact with the back cover 1112 and the second cover 23. The torsion biasing components 25 are configured to apply forces to the second cover 23 to open the insertion portion 1114. Note that the quantity of the torsion biasing components 25 is not restricted in the disclosure and may be modified to be one in some other embodiments.

Figure 8:
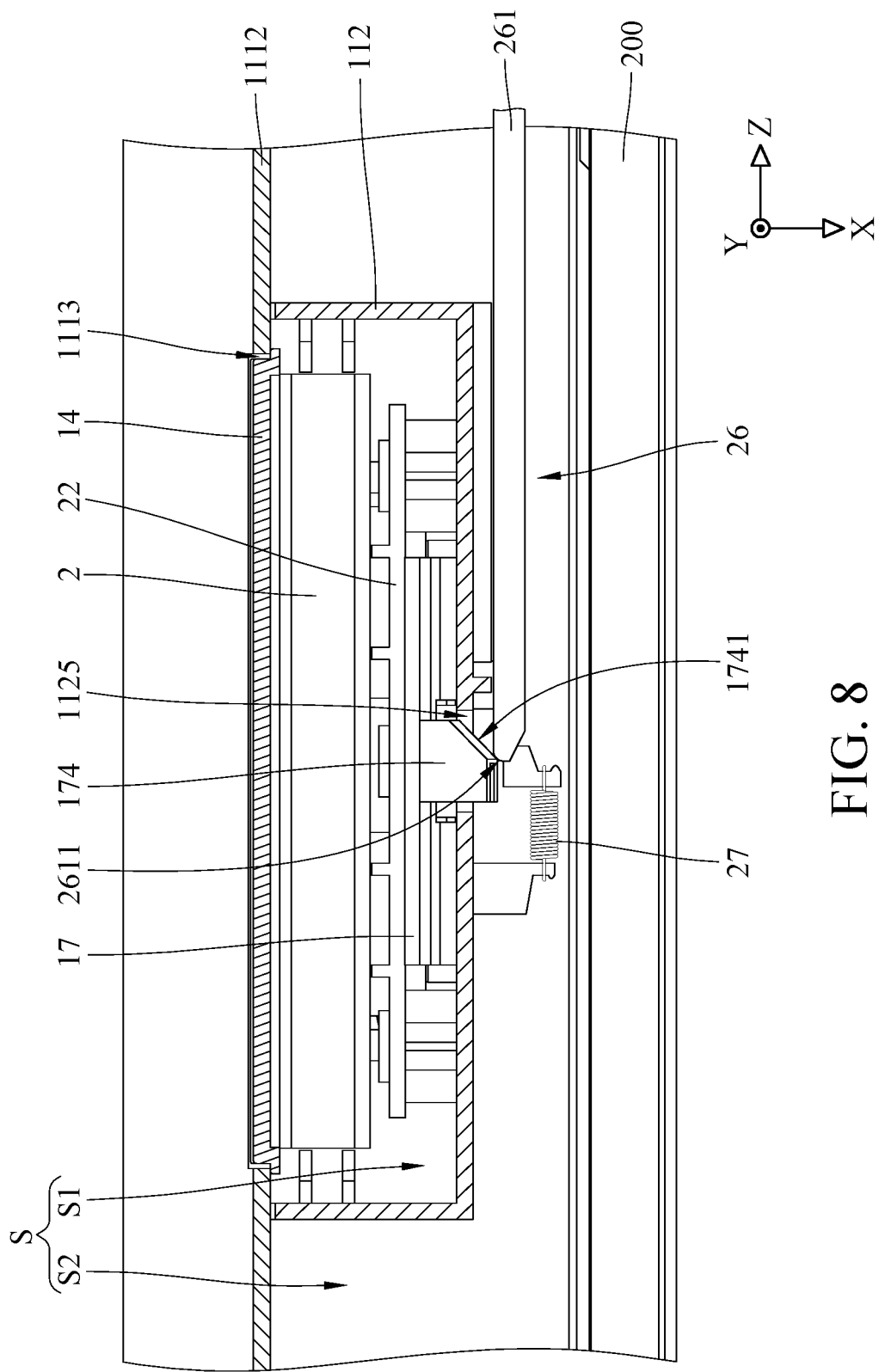
FIG. 8 is a partial and enlarged cross-sectional view of the monitor in FIG. 1.
Figure 9:
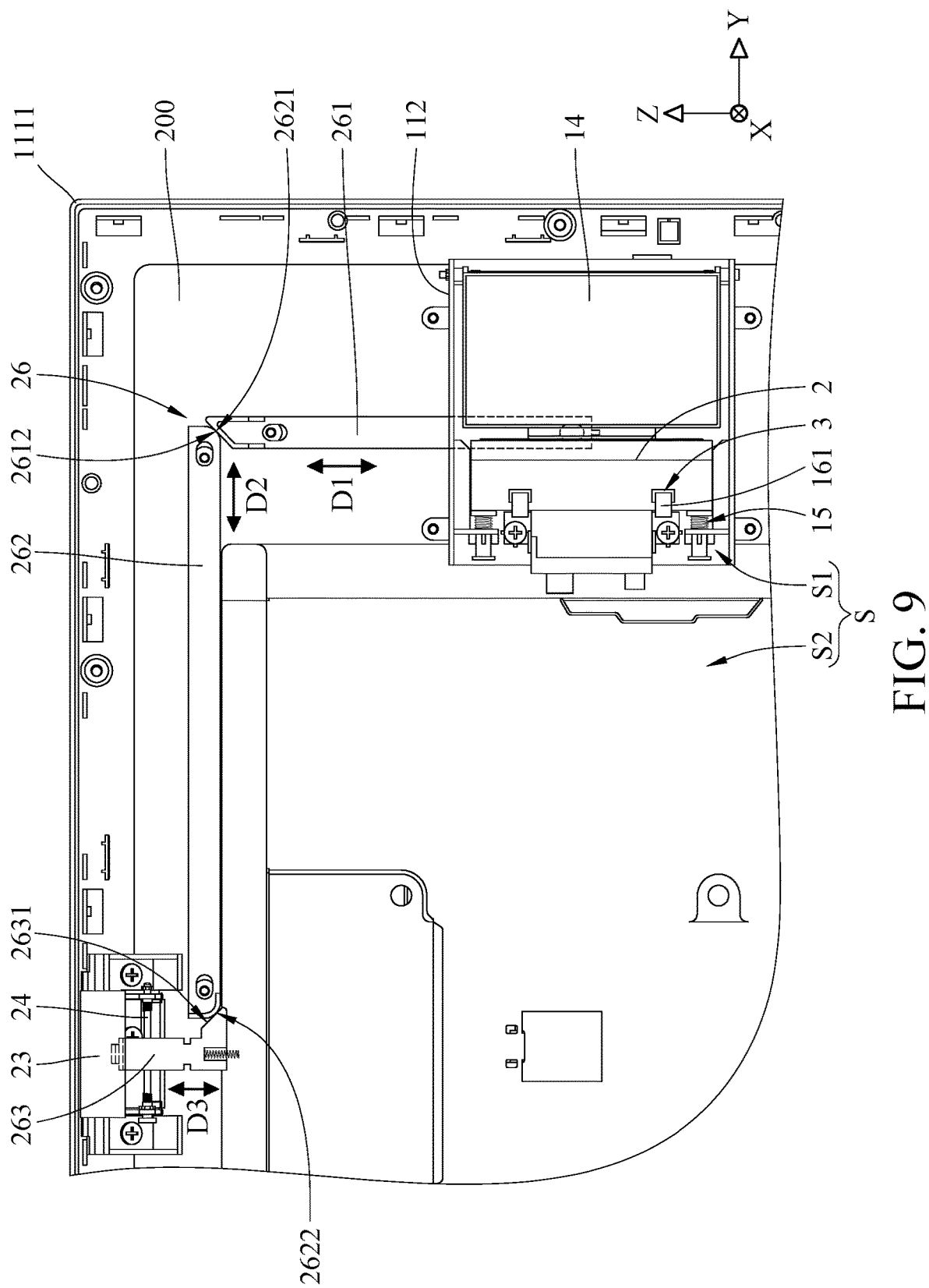
FIG. 9 is a partial schematic view of the monitor in FIG. 1 where a back cover is omitted.
Figure 10:
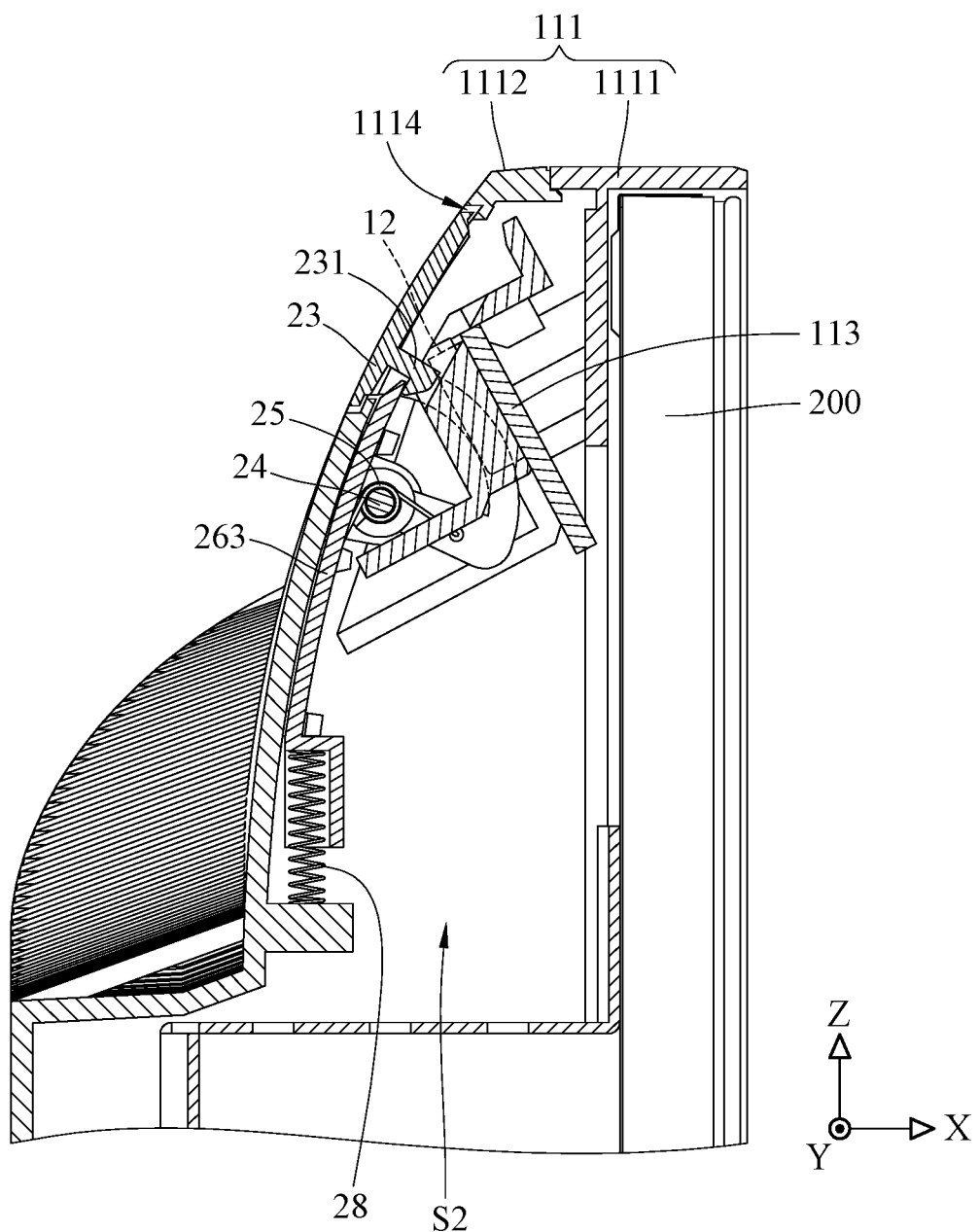
FIG. 10 is a partial and enlarged cross-sectional view of the monitor in FIG. 1.
Figure 11:
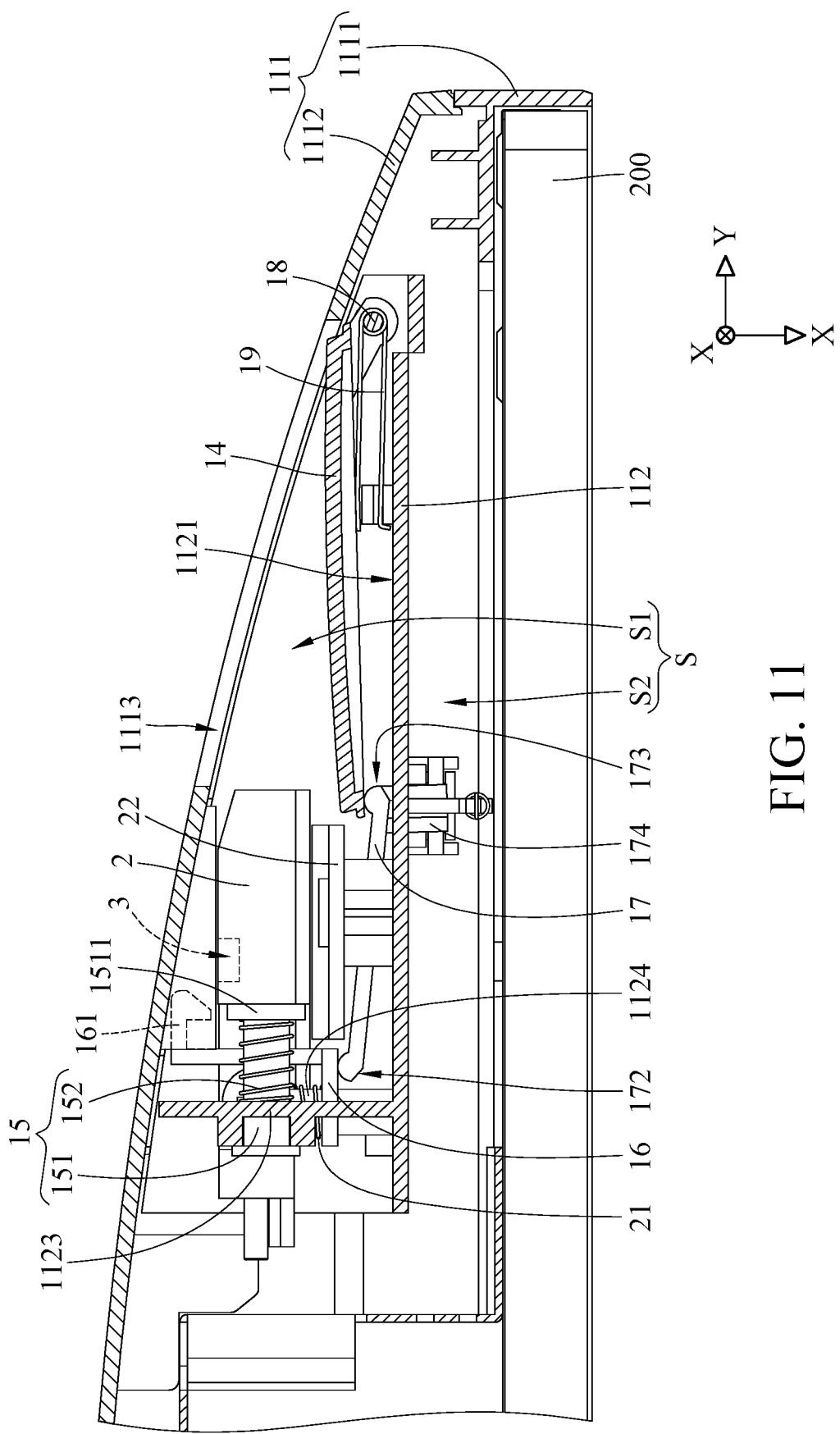
FIGS. 11 to 15 show the opening operation of the first cover and a second cover of the monitor.
Figure 12:
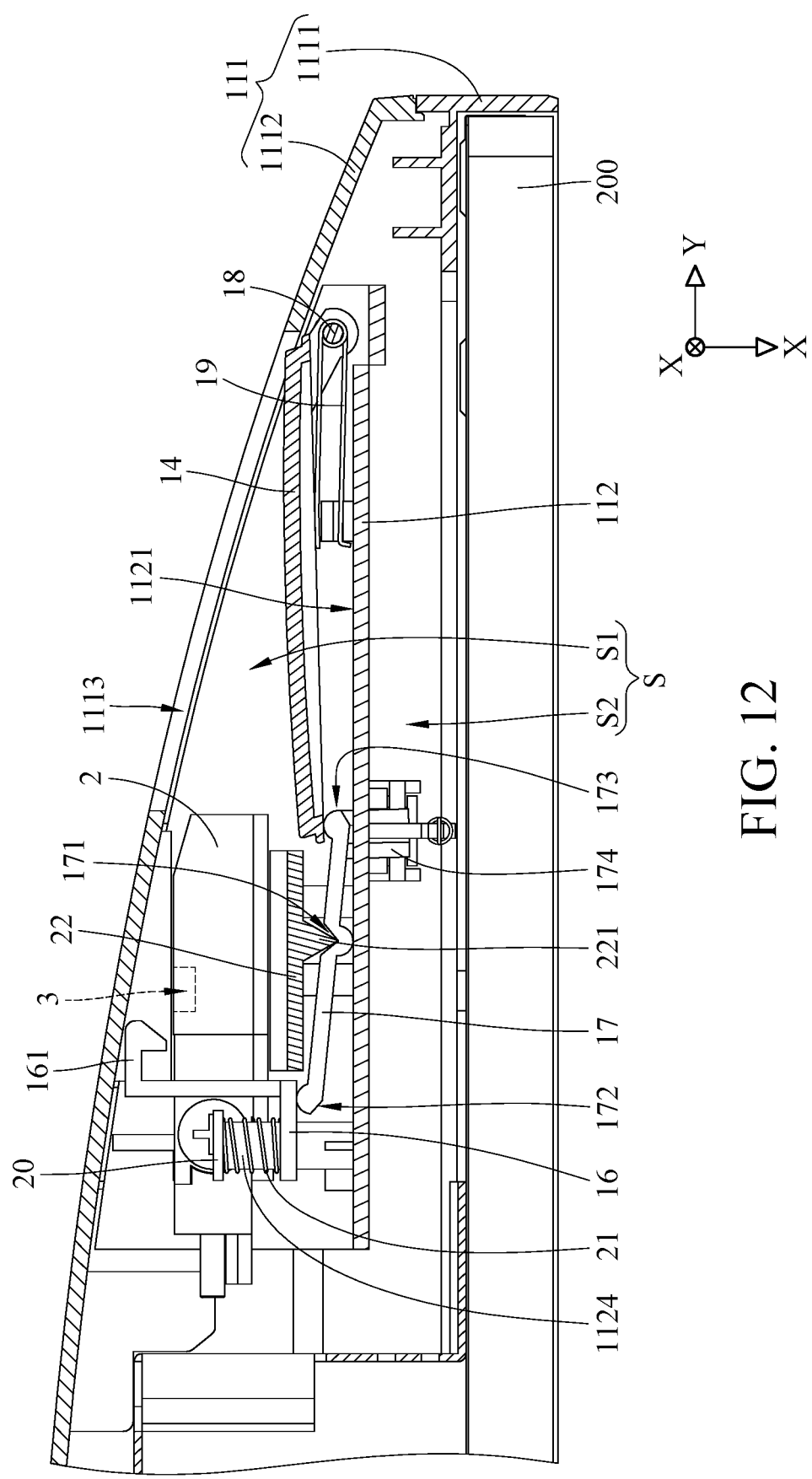
Figure 13:
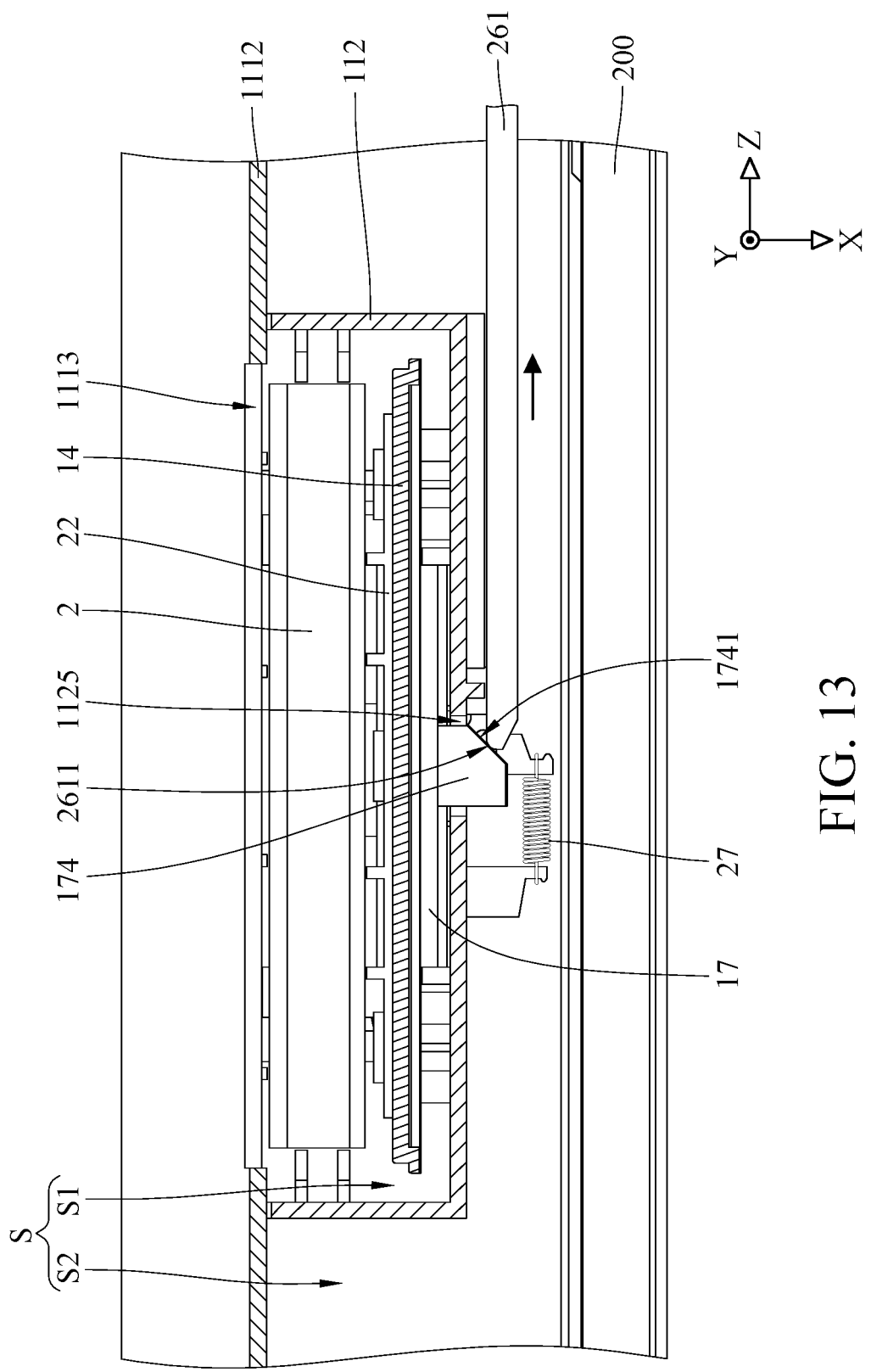
Figure 14:
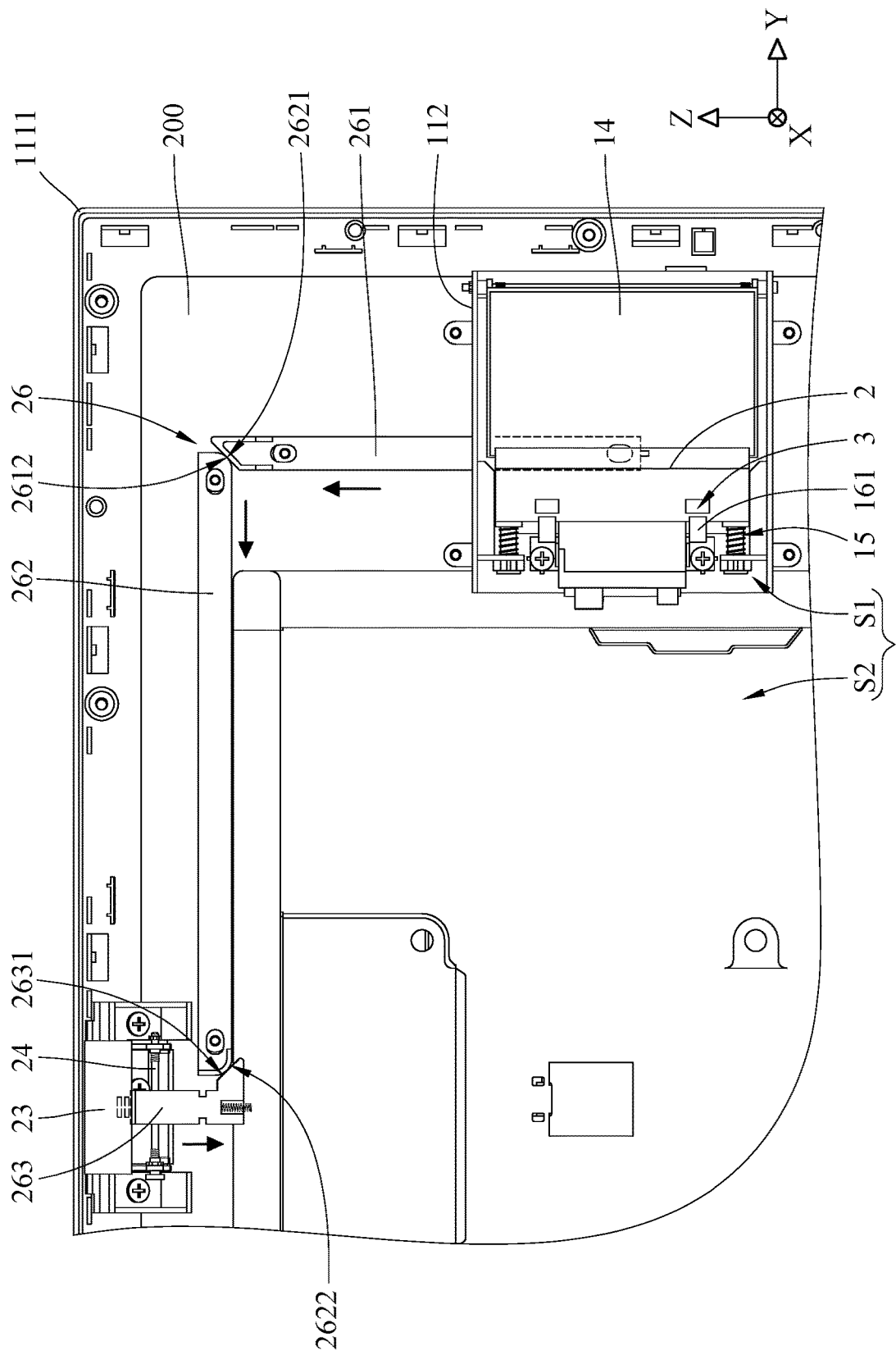
Figure 15:
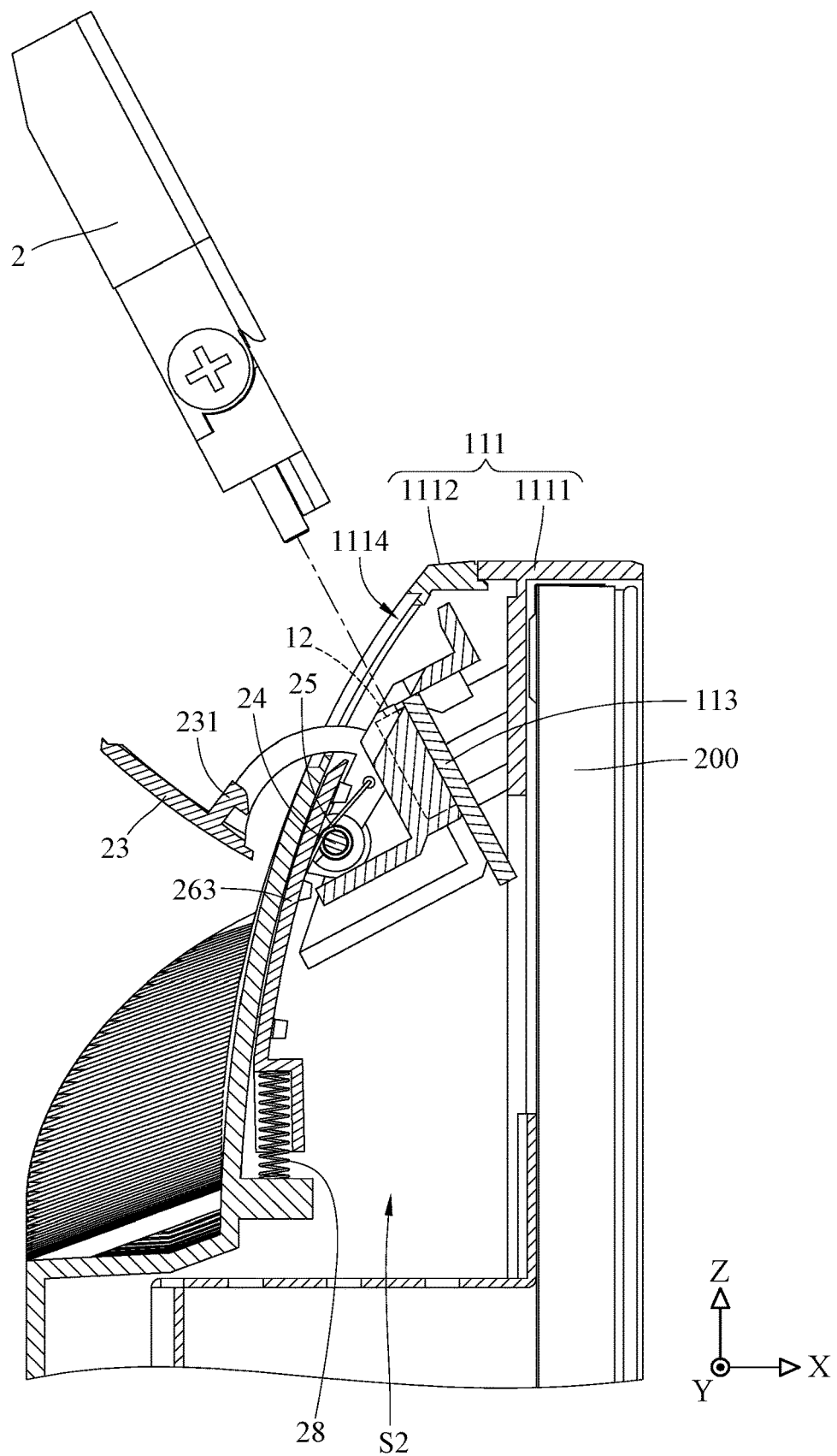

Then, referring to FIGS. 8 to 10, FIG. 8 is a partial and enlarged cross-sectional view of the monitor 1 in FIG. 1, FIG. 9 is a partial schematic view of the monitor 1 in FIG. 1 where the back cover 1112 is omitted, and FIG. 10 is a partial and enlarged cross-sectional view of the monitor 1 in FIG. 1.

As shown in FIGS. 8 and 9, the casing assembly 100 may further include a link mechanism 26, the storage seat 112 may further have a through hole 1125, and the swayable component 17 may further have a pushing protrusion 174. The pushing protrusion 174 protrudes from the second side 173 of the swayable component 17 and is disposed through the through hole 1125 of the storage seat 112. The link mechanism 26 is movably disposed in the second accommodation part S2, and one end of the link mechanism 26 is in contact with the pushing protrusion 174 of the swayable component 17, and another end of the link mechanism 26 is removably engaged with the second cover 23.

Specifically, as shown in FIGS. 8 and 9, the link mechanism 26 includes a first link 261, a second link 262 and a third link 263. The first link 261, the second link 262 and the third link 263 are slidably disposed in the second accommodation part S2. The first link 261 is in contact with the pushing protrusion 174 of the swayable component 17, two opposite ends of the second link 262 are respectively in contact with the first link 261 and the third link 263. The pushing protrusion 174, the first link 261, the second link 262 and the third link 263 are in contact with one another via inclined surfaces or curved surfaces. For example, the pushing protrusion 174 has an inclined surface 1741, the first link 261 has a curved surface 2611 and an inclined surface 2612 located opposite to each other, the second link 262 has two curved surfaces 2621 and 2622 located opposite to each other, and the third link 263 has an inclined surface 2631. The inclined surface 1741 of the pushing protrusion 174 is in contact with the curved surface 2611 of the first link 261, the inclined surface 2612 of the first link 261 is in contact with the curved surface 2621 of the second link 262, and the curved surface 2622 of the second link 262 is in contact with the inclined surface 2631 of the third link 263.

As shown in FIG. 8, the casing assembly 100 may further include a first restoring component 27. In one embodiment, the first restoring component 27 is, for example, an extension spring. Two opposite ends of the first restoring component 27 are respectively fixed to the storage seat 112 and the first link 261, and the first restoring component 27 is configured to apply a force to the first link 261 to move the first link 261 away from the second link 262.

As shown in FIG. 9, a slidable direction D1 of the first link 261 and a slidable direction D3 of the third link 263 is non-parallel to a slidable direction D2 of the second link 262. Specifically, the slidable direction D1 and the slidable direction D3 are perpendicular to the slidable direction D2 of the second link 262, but the disclosure is not limited thereto; in some other embodiments, the slidable direction of the first link and the slidable direction of the third link may be non-perpendicular and non-parallel to the slidable direction of the second link; that is, the slidable direction of the first link and the slidable direction of the third link may be at an angle not equal to 90 degrees to the slidable direction of the second link.

As shown in FIGS. 9 and 10, the second cover 23 has a hook structure 231, one end of the third link 263 located farther away from the second link 262 is removably engaged with the hook structure 231 of the second cover 23 so as to maintain the second cover 23 to be in a position where the second cover 30 covers the insertion portion 1114.

As shown in FIGS. 9 and 10, the casing assembly 100 may further include a second restoring component 28. In one embodiment, the second restoring component 28 is, for example, a compression spring. Two opposite ends of the second restoring component 28 are respectively in contact with the third link 263 and the back cover 1112, and the second restoring component 28 is configured to apply a force to the third link 263 to move the third link 263 towards the second cover 23. When there is no other force applied to the third link 263, the second restoring component 28 forces one end of the third link 263 located farther away from the second link 262 to stably engaged with the hook structure 231 of the second cover 23 so as to maintain the second cover 23 to be in a position where the second cover 23 covers the insertion portion 1114.

Then, the following paragraphs will introduce the withdrawal and installation of the electronic accessory 2 accommodated in the first accommodation part S1. Referring to FIGS. 11 to 15, FIGS. 11 to 15 show the opening operation of the first cover 14 and the second cover 23 of the monitor 1.

When the electronic accessory 2 is to be used, the first cover 14 is pressed downwards so as to open the access portion 1113 and press downwards the second side 173 of the swayable component 17, and thus the first side 172 of the swayable component 17 is lift upwards. At this moment, the engagement component 16 is lifted up by the first side 172 of the swayable component 17, such that the pressing components 21 are compressed by the engagement component 16, and the hook structures 161 of the engagement component 16 are disengaged from the engagement recesses 3 of the electronic accessory 2. After the hook structures 161 of the engagement component 16 are disengaged from the engagement recesses 3 of the electronic accessory 2, the elastic components 152 of the pushing mechanism 15 force the pushing components 151 to push the electronic accessory 2 towards the access portion 1113. As a result, a user can withdraw the electronic accessory 2 out of the first accommodation part S1 from the access portion 1113.

During the downward movement of the second side 173 of the swayable component 17 pressed by the first cover 14, the pushing protrusion 174 of the swayable component 17 located at the second side 173 presses against the curved surface 2611 of the first link 261 with its inclined surface 1741 so as to move the first link 261 and cause the first restoring component 27 to be elongated by the first link 261. Then, the first link 261 presses against the curved surface 2621 of the second link 262 with its inclined surface 2612 so as to move the second link 262. Then, the second link 262 presses against the inclined surface 2631 of the third link 263 with its curved surface 2622 so as to move the third link 263 and cause the second restoring component 28 to be pressed by the third link 263, and thus one end of the third link 263 located farther away from the second link 262 is disengaged from the hook structure 231 of the second cover 23. At this moment, the torsion biasing components 25 force the second cover 23 to open the insertion portion 1114 so as to expose the electrical connector 12. As a result, the electronic accessory 2 can be installed on the electrical connector 12 for the user to use the electronic accessory 2.

In this embodiment, the torsion biasing components 25 can force the second cover 23 to automatically open the insertion portion 1114 when one end of the third link 263 located farther away from the second link 262 is disengaged from the hook structure 231 of the second cover 23. However, the torsion biasing components 25 are optional components; in some other embodiments, the casing assembly may not include the torsion biasing components, and the second cover may be manually operated to open the insertion portion when one end of the third link located farther away from the second link is disengaged from the hook structure of the second cover.

In contrast, when there is no need to use the electronic accessory 2, the electronic accessory 2 can be removed from the electrical connector 12. Then, the electronic accessory 2 can be placed into the first accommodation part S1 when the first cover 14 is pressed downwards to open the access portion 1113, and then the electronic accessory 2 is pushed along a direction away from the access portion 1113. After the engagement recesses 3 of the electronic accessory 2 are aligned with the hook structures 161 of the engagement component 16, the first cover 14 is released, so that the pressing components 21 force the hook structures 161 of the engagement component 16 to engage with the engagement recesses 3 of the electronic accessory 2. At this moment, the torsion applying components 19 force the first cover 14 back to the position where the first cover 14 covers the access portion 1113, and the first restoring component 27 and the second restoring component 28 force the first link 261, the second link 262 and the third link 263 to move back to their original positions. Then, the second cover 23 is closed to cover the insertion portion 1114, and the hook structure 231 of the second cover 23 is engaged with the third link 263 so as to fix the second cover 23 in position. Therefore, the storage process of the electronic accessory 2 is finished, and the appearance of the monitor 1 recovers to integrity after the first cover 14 covers the access portion 1113 and the second cover 23 covers the insertion portion 1114.

In this embodiment, when the electronic accessory 2 is not required to be used, the electronic accessory 2 can be stored in the first accommodation part S1, and the first cover 14 can cover the access portion 1113 configured for withdrawing the electronic accessory 2, and the second cover 23 can cover the insertion portion 1114 configured for enabling the electronic accessory 2 to be installed on the electrical connector 12, and thus the integrity of the appearance of the monitor 1 can be maintained while meeting the requirement of storing the electronic accessory 2.

In this embodiment, the storage seat 112 is disposed in an idle space of the accommodation portion S to form the first accommodation part S1 for accommodating the electronic accessory 2, and thus the accommodation portion S is not required to be enlarged for accommodating the storage seat 112 of the electronic accessory 2, thereby ensuring the slimness of the monitor 1.

Note that the structure of the link mechanism 26 is not restricted in the disclosure and may be modified to any suitable structure as long as the link mechanism can be moved to disengage from the second cover when the first cover is pressed downwards.

Figure 16:
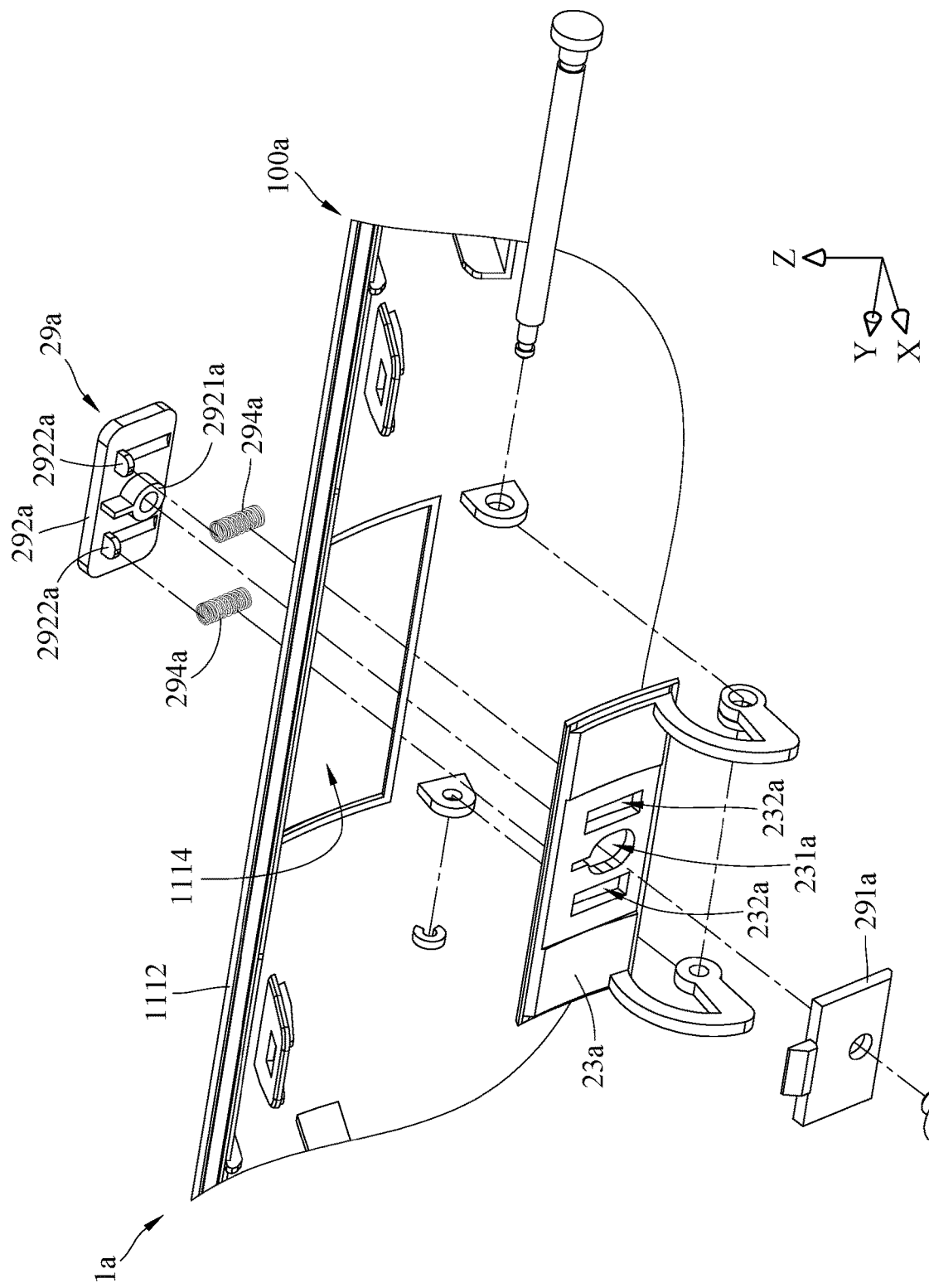
FIG. 16 is a partial and enlarged exploded view of a monitor according to a second embodiment of the disclosure.

In addition, the link mechanism 26 is an optional component; in some other embodiments, the casing assembly may not include the link mechanism, and the opening process of the second cover covering the insertion portion may be independent from the opening process of the first cover covering the access portion; that is, when the first cover is pressed downwards to open the access portion, whether the second cover opens the access portion is irrelevant to the aforementioned process. For example, referring to FIGS. 16 and 17, FIG. 16 is a partial and enlarged exploded view of a monitor 1a according to a second embodiment of the disclosure, and FIG. 17 is a partial and enlarged cross-sectional view of the monitor 1a in FIG. 16.

The monitor 1a of this embodiment is similar to the monitor 1 of the previous embodiment, but a casing assembly 100a of the monitor 1a does not include the aforementioned link mechanism 26 and the structures relevant to the link mechanism 26. The following paragraphs will mainly introduce the differences between the casing assembly 100a of the monitor 1a of this embodiment and the casing assembly 100 of the monitor 1 of the previous embodiment, and the same part between them can be referred to the paragraphs of the previous embodiment and will not be repeatedly introduced hereinafter.

In this embodiment, the casing assembly 100a further includes a latch assembly 29a, and the latch assembly 29a is slidably disposed on the second cover 23a and removably engaged with the back cover 1112. Specifically, the second cover 23a has a guide slot 231a and two accommodation slots 232a, and the guide slot 231a is located between the two accommodation slots 232a. The latch assembly 29a includes an engagement block 291a, an operation block 292a, a fastener 293a and two elastic force applying components 294a. The engagement block 291a is stacked on the second cover 23a. The operation block 292a has a mount portion 2921a and two pressed portions 2922a. The mount portion 2921a is disposed through the guide slot 231a and is movable in the guide slot 231a, and the pressed portions 2922a are respectively and movably located in the accommodation slots 232a. The fastener 293a is disposed through the engagement block 291a and fastened into the mount portion 2921a. The elastic force applying components 294a are respectively located in the accommodation slots 232a, and opposite ends of the elastic force applying components 294a are respectively in contact with the pressed portions 2922a and inner surfaces of the accommodation slots 232a. The elastic force applying components 294a are configured to apply forces to the operation block 292a to move the engagement block 291a towards the back cover 1112. When there is no other force applied to the operation block 292a, the elastic force applying components 294a force the engagement block 291a to engaged with the back cover 1112 via the operation block 292a.

Figure 17:
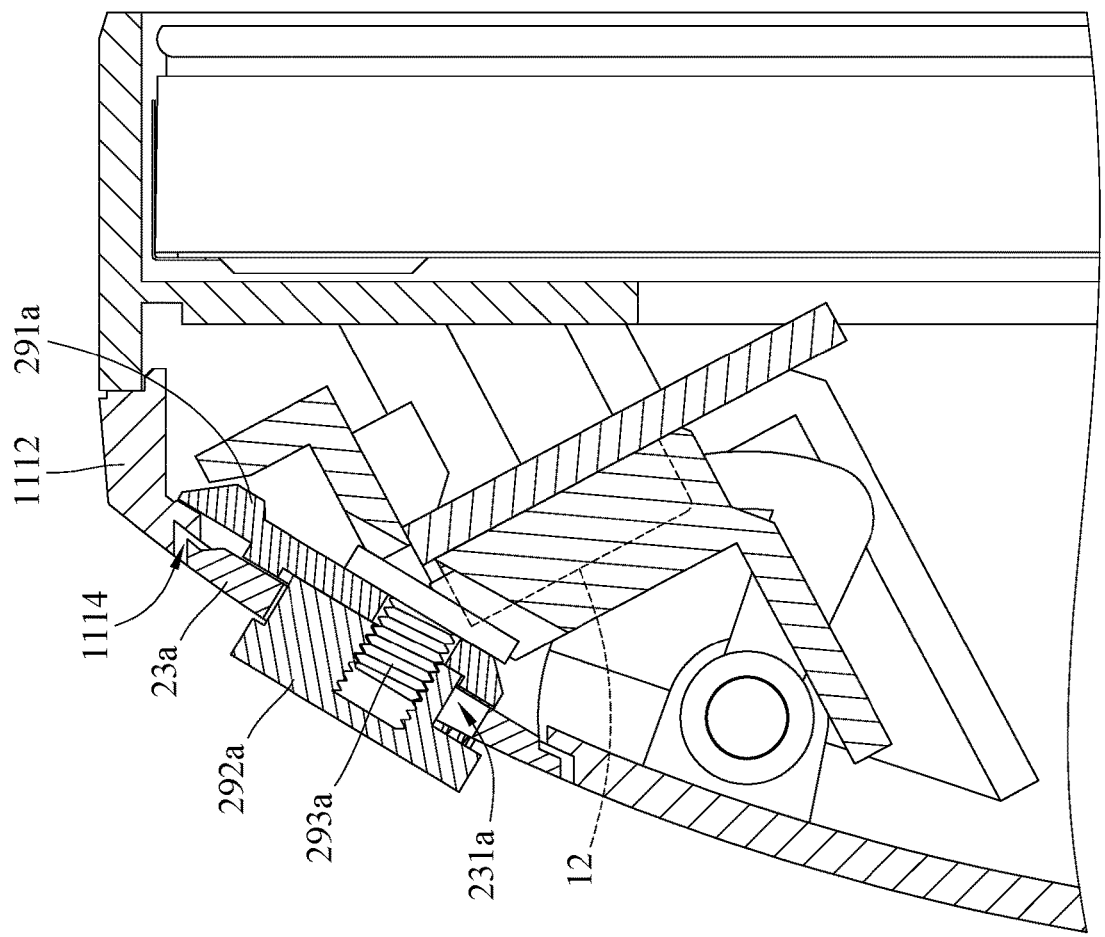
FIG. 17 is a partial and enlarged cross-sectional view of the monitor in FIG. 16.
Figure 18:
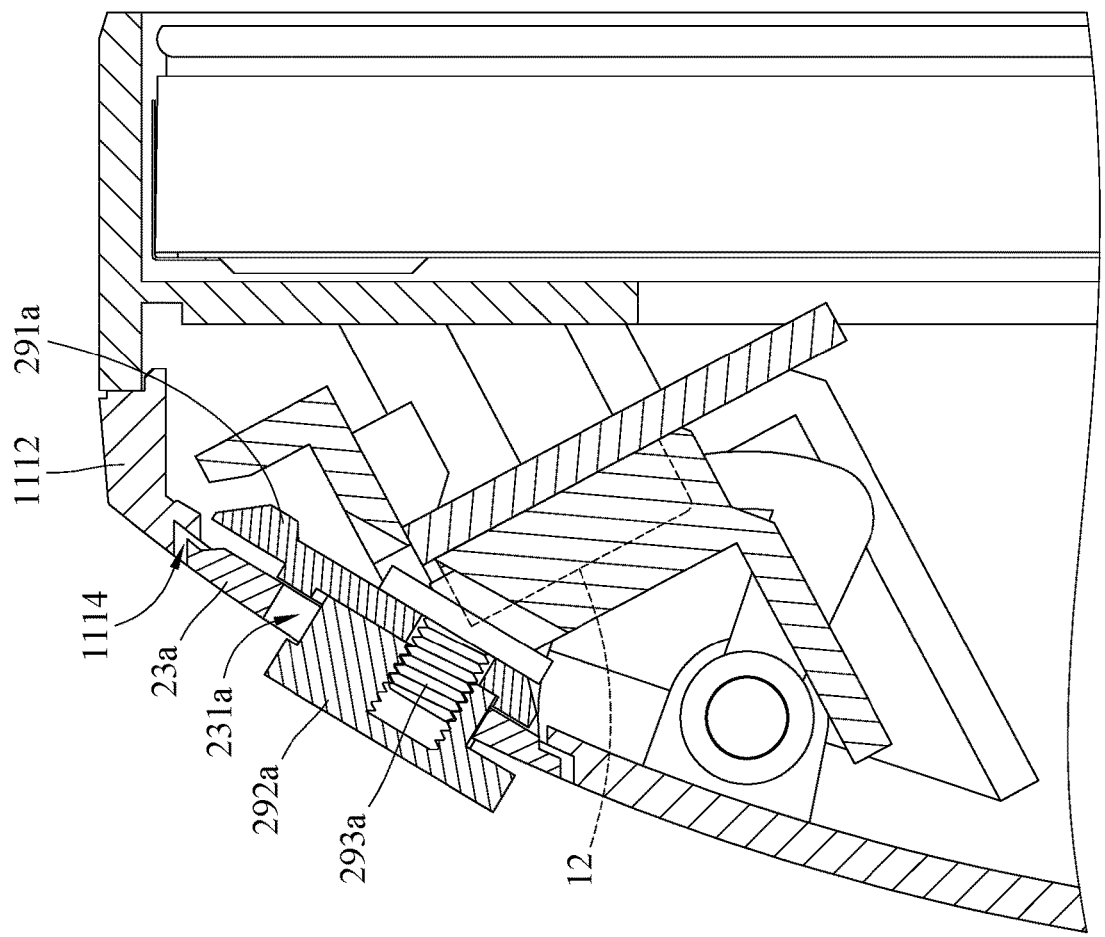
FIG. 18 is a partial and enlarged cross-sectional view of the monitor in FIG. 17 when an operation block is operated.

Then, referring to FIG. 18, FIG. 18 is a partial and enlarged cross-sectional view of the monitor 1a in FIG. 17 when the operation block 292a is operated. By sliding the operation block 292a, the engagement block 291a can be moved to disengage from the back cover 1112. Therefore, the second cover 23a can be manually pivoted relative to the back cover 1112 so as to open the insertion portion 1114 and expose the electrical connector 12.

In the aforementioned embodiments, the engagement component is configured to be engaged with the electronic accessory, and the engagement component can be moved by the swayable component to be disengaged from the electronic accessory, but the disclosure is not limited thereto; in some other embodiments, the casing assembly may not include the engagement component and the swayable component, the electronic accessory may be removably fixed in the storage seat via other components or structures of the storage seat, and the electronic accessory may be moved by another type of components to be disengaged from the storage seat.

Moreover, the electrical connector is located in the casing and covered by the second cover, but the disclosure is not limited thereto; in some other embodiments, the electrical connector may be exposed from the casing.

In addition, the casing assembly is applied in the monitor, but the disclosure is not limited thereto; in some other embodiments, the casing assembly may be applied in another type of electronic products, such as a laptop computer.

According to the casing assemblies and the monitors as discussed in the above embodiments, when the electronic accessory is not required to be used, the electronic accessory can be stored in the first accommodation part, and the first cover can cover the access portion configured for withdrawing the electronic accessory, and the second cover can cover the insertion portion configured for enabling the electronic accessory to be installed on the electrical connector, and thus the integrity of the appearance of the monitor can be maintained while meeting the requirement of storing the electronic accessory.

In addition, the storage seat is disposed in an idle space of the accommodation portion to form the first accommodation part for accommodating the electronic accessory, and thus the accommodation portion is not required to be enlarged for accommodating the storage seat of the electronic accessory, thereby ensuring the slimness of the monitor.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A casing assembly, selectively accommodating an electronic accessory, the casing assembly comprising:
   a casing, having an accommodation portion and an access portion, wherein the accommodation portion selectively accommodates the electronic accessory, and the access portion communicates with the accommodation portion;
   an electrical connector, disposed on the casing and selectively connected to the electronic accessory;
   a first cover, movably disposed on the casing and covering the access portion; and a pushing mechanism, movably disposed in the accommodation portion, wherein when the first cover is pressed downwards to expose the access portion, the pushing mechanism pushes the electronic accessory towards the access portion.

2. The casing assembly according to claim 1, wherein the pushing mechanism comprises a pushing component and an elastic component, the pushing component is slidably disposed in the accommodation portion and is in contact with the electronic accessory, the elastic component is disposed on the pushing component, and the elastic component applies a force to the pushing component to push the electronic accessory towards the access portion.

3. The casing assembly according to claim 1, further comprising an engagement component and a swayable component, wherein the engagement component is slidably disposed in the accommodation portion and removably engaged with the electronic accessory, the swayable component is movably disposed in the accommodation portion, the swayable component has a first side and a second side located opposite to each other, the first side of the swayable component is in contact with the engagement component, the second side of the swayable component corresponds to the first cover; when the first cover is pressed downwards, the first cover drives the swayable component to move the engagement component to disengage from the electronic accessory for allowing the pushing mechanism to push the electronic accessory towards the access portion.

4. The casing assembly according to claim 3, further comprising a pressing component, wherein the pressing component is disposed on the engagement component, and the pressing component applies a force to the engagement component to move the engagement component towards the electronic accessory.

5. The casing assembly according to claim 3, further comprising a second cover, wherein the casing further has an insertion portion communicating with the accommodation portion, the electrical connector is located in the accommodation portion and corresponds to the insertion portion, and the second cover is movably disposed on the casing and covers the insertion portion.

6. The casing assembly according to claim 5, further comprising a link mechanism and a torsion biasing component, wherein the second cover is pivotably disposed on the casing, the swayable component has a pushing protrusion protruding from the second side, the link mechanism is movably disposed in the accommodation portion, one end of the link mechanism is in contact with the pushing protrusion of the swayable component, another end of the link mechanism is removably engaged with the second cover; when the first cover is pressed downwards, the first cover drives the swayable component to move the link mechanism to disengage from the second cover; the torsion biasing component is disposed on the second cover, and the torsion biasing component applies a force to the second cover to open the insertion portion.

7. The casing assembly according to claim 6, wherein the access portion and the insertion portion are respectively located at two adjacent sides of the casing, the link mechanism comprises a first link, a second link and a third link, the first link, the second link and the third link are respectively and movably disposed in the accommodation portion, the first link is in contact with the pushing protrusion of the swayable component, two opposite ends of the second link are respectively in contact with the first link and the third link, the third link is removably engaged with the second cover, and a slidable direction of the first link and a slidable direction of the third link are non-parallel to a slidable direction of the second link.

8. The casing assembly according to claim 7, wherein the slidable direction of the first link and the slidable direction of the third link are perpendicular to the slidable direction of the second link.

9. The casing assembly according to claim 7, wherein the pushing protrusion, the first link, the second link and the third link are in contact with one another via inclined surfaces or curved surfaces.

10. The casing assembly according to claim 7, further comprising a first restoring component and a second restoring component, wherein the first restoring component is disposed on the first link and applies a force to the first link to move the first link away from the second link, and the second restoring component is disposed on the third link and applies a force to the third link to move the third link towards the second cover.

11. The casing assembly according to claim 5, further comprising a latch assembly, wherein the latch assembly is slidably disposed on the second cover and removably engaged with the casing.

12. The casing assembly according to claim 11, wherein the second cover has a guide slot, the latch assembly comprises an engagement block, an operation block, a fastener and an elastic force applying component, the engagement block is stacked on the second cover, the operation block has a mount portion, the mount portion is disposed through the guide slot and is movable in the guide slot, the fastener is disposed through the engagement block and is fastened into the mount portion, and the elastic force applying component is disposed on the operation block and applies a force to the operation block to move the engagement block towards the casing.

13. The casing assembly according to claim 1, further comprising a torsion applying component, wherein the first cover is pivotably disposed on the casing, the torsion applying component is disposed on the first cover, and the torsion applying component applies a force to the first cover to cover the access portion.

14. The casing assembly according to claim 1, wherein the casing comprises a main body and a storage seat, the accommodation portion and the access portion is located at the main body, the storage seat is fixed to the main body and divides the accommodation portion into a first accommodation part and a second accommodation part, the first accommodation part selectively accommodates the electronic accessory, and the pushing mechanism is movably disposed on the storage seat.

15. A monitor, selectively accommodating an electronic accessory, the monitor comprising:
a casing assembly, comprising:
a casing, having an accommodation portion and an access portion, wherein the accommodation portion selectively accommodates the electronic accessory, and the access portion communicates with the accommodation portion;
an electrical connector, disposed on the casing and selectively connected to the electronic accessory;
a first cover, movably disposed on the casing and covering the access portion; and
a pushing mechanism, movably disposed in the accommodation portion, wherein when the first cover is pressed downwards to expose the access portion, the pushing mechanism pushes the electronic accessory towards the access portion; and a display panel, disposed in the accommodation portion of the casing.

16. The monitor according to claim 15, wherein the pushing mechanism comprises a pushing component and an elastic component, the pushing component is slidably disposed in the accommodation portion and is in contact with the electronic accessory, the elastic component is disposed on the pushing component, and the elastic component applies a force to the pushing component to push the electronic accessory towards the access portion.

17. The monitor according to claim 15, wherein the casing assembly comprises an engagement component and a swayable component, the engagement component is slidably disposed in the accommodation portion and removably engaged with the electronic accessory, the swayable component is movably disposed in the accommodation portion, the swayable component has a first side and a second side located opposite to each other, the first side of the swayable component is in contact with the engagement component, the second side of the swayable component corresponds to the first cover; when the first cover is pressed downwards, the first cover drives the swayable component to move the engagement component to disengage from the electronic accessory for allowing the pushing mechanism to push the electronic accessory towards the access portion.

18. The monitor according to claim 17, wherein the casing assembly further comprises a second cover, the casing further has an insertion portion communicating with the accommodation portion, the electrical connector is located in the accommodation portion and corresponds to the insertion portion, and the second cover is movably disposed on the casing and covers the insertion portion.

19. The monitor according to claim 18, wherein the casing assembly further comprises a link mechanism and a torsion biasing component, the second cover is pivotably disposed on the casing and covers the insertion portion, the swayable component has a pushing protrusion protruding from the second side, the link mechanism is movably disposed in the accommodation portion, one end of the link mechanism is in contact with the pushing protrusion of the swayable component, another end of the link mechanism is removably engaged with the second cover; when the first cover is pressed downwards, the first cover drives the swayable component to move the link mechanism to disengage from the second cover; the torsion biasing component is disposed on the second cover, and the torsion biasing component applies a force to the second cover to open the insertion portion.

20. The monitor according to claim 18, wherein the casing assembly further comprises a latch assembly, and the latch assembly is slidably disposed on the second cover and removably engaged with the casing.

* * * * *